United States Patent
Cole et al.

[11] Patent Number: 6,094,735
[45] Date of Patent: Jul. 25, 2000

[54] SPEED-SIGNALING TESTING FOR INTEGRATED CIRCUITS

[75] Inventors: Clifford B. Cole, Emmaus; Joseph D. Coyne, Lansdale; Bijit T. Patel, Breinigsville; Michael Shinkarovsky, Blue Bell, all of Pa.

[73] Assignee: Lucent Technologies Inc., Murray Hill, N.J.

[21] Appl. No.: 09/128,041

[22] Filed: Aug. 3, 1998

[51] Int. Cl.[7] ............................................. G01R 31/28
[52] U.S. Cl. ........................................ 714/724; 324/158.1
[58] Field of Search ................................... 714/724, 718, 714/719, 731, 738; 324/73.1, 158.1, 76.11

[56] References Cited

U.S. PATENT DOCUMENTS

| | | | |
|---|---|---|---|
| 4,635,247 | 1/1987 | Tejima | 370/13 |
| 4,792,951 | 12/1988 | Nielsen | 714/738 |
| 5,049,814 | 9/1991 | Walker, III et al. | 324/258.1 |
| 5,590,137 | 12/1996 | Yamashita | 714/738 |

FOREIGN PATENT DOCUMENTS 0818902  1/1998  European Pat. Off. .

*Primary Examiner*—Hoa T. Nguyen
*Attorney, Agent, or Firm*—Steve Mendelsohn

[57] ABSTRACT

An integrated circuit has digital logic that supports two or more different processing speeds and two or more different data rates that are distinguished by each data rate having a data prefix at a different common-mode voltage. For normal processing, the integrated circuit has one or more comparators that compare the average signal voltage level with one or more reference voltages to determine the data rate. According to one embodiment of the invention, one or more muxes are configured between the comparators and the digital logic. These muxes can be controlled during testing to by-pass the operations of the comparators to pass specified digital codes to the digital logic to simulate the operations of the comparators. In this way, the different processing speeds of the digital logic can be tested without having to build special automatic test equipment to support all of the different possible voltage levels corresponding to the different supported data rates.

5 Claims, 1 Drawing Sheet

SPEED-SIGNALING TESTING FOR INTEGRATED CIRCUITS

BACKGROUND OF THE INVENTION

1. Field of the Invention

The present invention relates to integrated circuits (ICs), and, in particular, to testing ICs that can process data at two or more different data rates.

2. Description of the Related Art

FIG. 1 shows a block diagram of an integrated circuit 100 that can process data at three different processing speeds: 100 megabits per second (Mbps), 200 Mpbs, and 400 Mpbs. Ternary input data to digital logic 102 of FIG. 1, namely 1, 0, and Z (i.e., high-impedance state), are represented by differential signaling, in which the differential signal is transmitted as a small-swing differential voltage (e.g., about 200 mV) centered around a common-mode voltage, called Tpbias. For example, for the differential pair A and A*, the logic levels may be determined as follows:

If (VA–VA*)>168 mV, then signal="1"

If (VA–VA*)<–168 mV, then signal="0"

If |(VA–VA*)|<168 mV, then signal="Z"

where VA and VA* represent the voltage levels of differential signals A and A*, respectively. For example, if the small-swing differential is centered about a common-mode voltage Tpbias=1.9 V, then ideally:

Signal="1": VA=2.0V and VA*=1.8V

Signal="0": VA=1.8V and VA*=2.0V

Signal="Z": VA=1.9V and VA*=1.9V

IC 100 of FIG. 1 is designed such that the data rate for each burst of data is signaled by the common-mode voltage of a data prefix that precedes the burst of data. The data-prefix common-mode voltage is different for each different data rate. For example, the data-prefix common-mode voltage may be 1.9 V for the 100-Mbps data rate, 1.7 V for the 200-Mbps data rate, and 1.4 V for the 400-Mbps data rate. For differential signaling with a 200-mV voltage swing, the differential signals for the data prefix for the 100-Mbps data rate will have voltage levels of 1.8 V, 1.9 V, and 2.0 V. Similarly, the 200-Mbps data-prefix differential signals will have voltage levels of 1.6 V, 1.7 V, and 1.8 V, while the 400-Mbps data-prefix differential signals will have voltage levels of 1.3 V, 1.4 V, and 1.5 V. Although the common-mode voltage is changed in the data prefix to signal the data rate of the incoming burst of data, the common-mode voltage is returned to its normal level Tpbias (e.g., 1.9 V) for the differential signals in the burst of data itself.

Comparator 104 of IC 100 compares the average voltage level Vcm of the data-prefix differential signals to a reference voltage Vref_200 and generates a binary output signal (i.e., comparator code bit B0) that indicates whether Vcm is greater than or less than Vref_200. Similarly, comparator 106 of IC 100 compares the average voltage level Vcm to a reference voltage Vref_400 and generates a binary output signal (i.e., comparator code bit B1) that indicates whether Vcm is greater than or less than Vref_400.

By selecting appropriate values for Vref_200 and Vref_400, analog comparators 104 and 106 can be used to generate a 2-bit rate code for digital logic 102. A rate code is digital code whose value is used to indicate the data rate. The 2-bit rate code for digital logic 102 indicates whether the data-prefix differential signals used to generate Vcm precede a burst of data having a 100-Mbps, a 200-Mbps, or a 400-Mbps data rate, so that digital logic 102 can adjust its processing speed accordingly. For example, Table I shows the 2-bit rate code values generated by comparators 104 and 106 for the different data rates, when Vref_200=1.8 V and Vref_400=1.55 V. Other rate codes are also possible, including rate codes having a number of bits other than 2.

As indicated in Table I, when the data-prefix differential signals are for the 100-Mbps data rate, the common mode voltage Vcm will be about 1.9 V, which is larger than both Vref_200 (=1.8V) and Vref_400 (=1.55V). As such, comparators 104 and 106 will both output 0s. On the other hand, when the data-prefix differential signals are for the 200-Mbps data rate, the common mode voltage Vcm will be about 1.7 V, which is larger than Vref_400, but smaller than Vref_200. In that case, comparator 104 will output 1 and comparator 106 will output 0. And when the data-prefix differential signals are for the 400-Mbps data rate, the common mode voltage Vcm will be about 1.55 V, which is smaller than both larger Vref_200 and Vref_400. In that case, both comparators 104 and 106 will output 1s.

TABLE I

| DATA RATE | Vcm | B1 | B0 |
| --- | --- | --- | --- |
| 100 Mbps | ~1.9 V | 0 | 0 |
| 200 Mbps | ~1.7 V | 0 | 1 |
| 400 Mbps | ~1.55 V | 1 | 1 |

In a manufacturing environment, automatic test equipment (ATE) tester channels may be used to emulate the behavior of a peer of IC 100 of FIG. 1. To fully fault test IC 100, the data rate and processing speed must be varied during the ATE test. In order to test all three data rates supported by computer processor 100, automatic test equipment would have to have enough tester channels to generate signals having all of the different voltages associated with those different data rates. For example, for the three specific data rates discussed earlier, the test equipment would have to support 8 different voltage levels: 1.3 V, 1.4 V, 1.5 V, 1.6 V, 1.7 V, 1.8 V, 1.9 V, and 2.0 V, with the being used for both the 100-Mbps and 200-Mbps data rates. Even with maximal efficiency, where each data rate shares two voltage levels with another data rate, the minimum number of different voltage levels that automatic test equipment must support for three different data rates is five.

Building automatic test equipment with additional tester channels can be difficult and expensive. Each additional channel creates additional problems due to fixed termination requirements. Additional channels create impedance mismatches and reflections, and require complex vectors to be generated to create the appropriate level on the bus.

SUMMARY OF THE INVENTION

The present invention is directed to a scheme for efficiently testing integrated circuits that support different data and processing rates, using automatic test equipment. In one embodiment, the present invention is an integrated circuit comprising (a) digital logic, adapted to process data at two or more different processing speeds and configured to receive differential input data at two or more different data rates, wherein, for each data rate, the differential input data has a data prefix at a different common-mode voltage level;

(b) at least one comparator, configured to compare the common-mode voltage level of the data prefix to at least one reference voltage to determine the data rate of the differential input data and to provide a comparator code value to the digital logic identifying the data rate of the differential input data; and (c) a comparator-by-pass circuit, configured between the comparator and the digital logic, configured to receive a by-pass code value and selectively enabled to by-pass the comparator code value and to provide the by-pass code value to the digital logic.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 1:
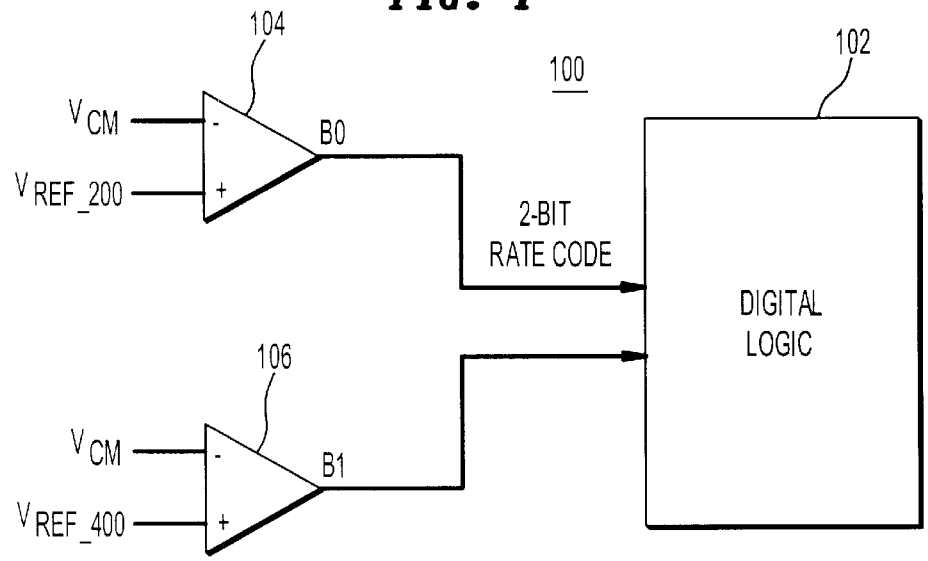
FIG. 1 shows a block diagram of an integrated circuit that can process data at three different processing speeds.
Figure 2:
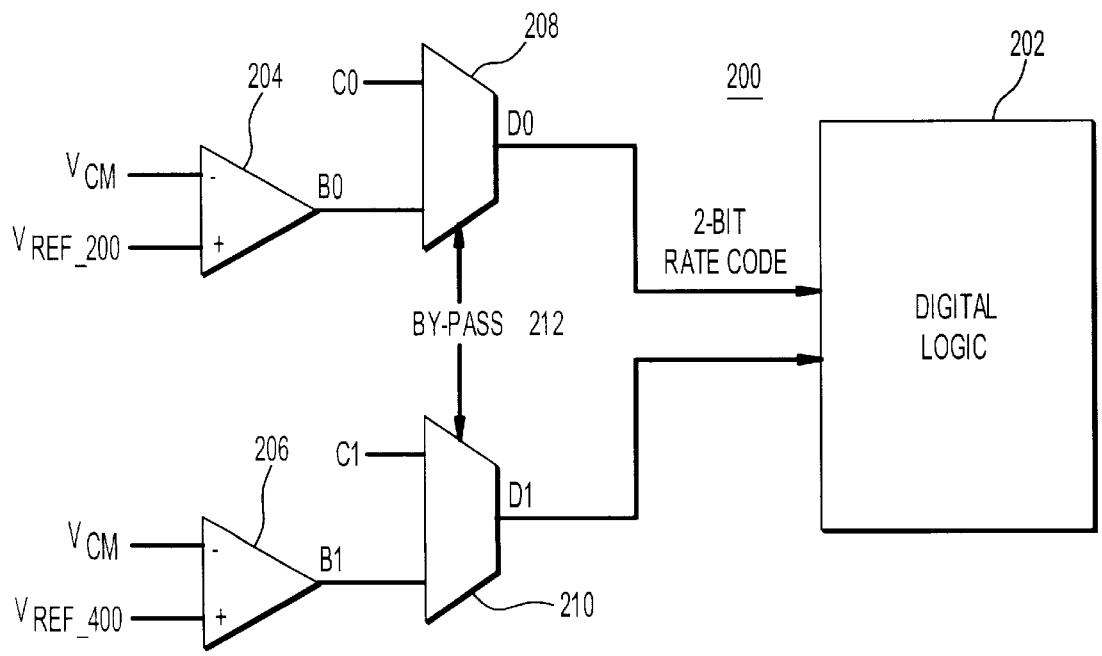
FIG. 2 shows a block diagram of an integrated circuit, according to one embodiment of the present invention.

FIG. 2 shows a block diagram of an integrated circuit 200, according to one embodiment of the present invention. Like IC 100 of FIG. 1, IC 200 can process data at three different processing speeds: 100 megabits per second (Mbps), 200 Mpbs, and 400 Mpbs. IC 200 has digital logic 202 and comparators 204 and 206 that operate analogously to digital logic 102 and comparators 104 and 106 of IC 100 of FIG. 1, respectively. In addition, however, IC 200 has two multiplexers—mux 208 and mux 210—configured between digital logic 202 and comparators 204 and 206, respectively. In addition to receiving the comparator code bit (B0 or B1) from its corresponding comparator as an input, each mux also receives a by-pass code bit (C0 or C1) as a second input. A by-pass control signal 212 controls whether the comparator code bit or the by-pass code bit is the output (D0 or D1) from each mux. By setting by-pass control signal 212 to select the by-pass code bits C0 and C1, rather than the comparator code bits B0 and B1, the processing of comparators 204 and 206 can effectively be by-passed.

Muxes 208 and 210 of IC 200 provide an efficient mechanism for testing all of the processing speeds of digital logic 202. For example, during testing in a manufacturing environment, by-pass control signal 212 can be set (e.g., to 1) to by-pass comparator operations by causing muxes 208 and 210 to pass the by-pass code bits to digital logic 202. The values for the by-pass code bits are selected to correspond to the desired data rate (e.g., (00) for 100 Mbps, (01) for 200 Mbps, and (11) for 400 Mbps as in Table I). Preferably, the by-pass code bits are input to digital logic 202 before the differential data are applied to give the digital logic time to configure itself for the appropriate processing speed.

Under the present invention, the digital logic can be tested at all of the different data rates and processing speeds without having to build automatic test equipment with additional tester channels. This allows existing three-channel automatic test equipment to support testing of ICs, like IC 200 of FIG. 2, that support two or more differential data rates.

Depending on the implementation, the by-pass code bits can be generated either internally or externally and used to emulate the output of the comparators. In this way, the digital logic will think it is receiving its normal comparator code bits. Moreover, by observing the output from the muxes, it is possible to isolate faults between the analog comparators and the digital logic.

For processing other than testing, the by-pass control signal is set (e.g., to 0) to enable the outputs from the comparators to be passed by the muxes to the digital logic.

Although FIG. 2 shows one one-bit mux for each comparator, the invention can also be implemented using a single two-bit mux that receives two two-bit inputs (a two-bit comparator code from the two comparators and a two-bit by-pass code) and generates a two-bit output. Moreover, in alternative embodiments, suitable components other than muxes can be used to control the flow of code bits to the digital logic.

Although the present invention has been described in the context of an integrated circuit that supports three different processing speeds and three data rates of 100 Mbps, 200 Mbps, and 400 Mbps, it will be understood that the present invention can be implemented for different data rates having different common-mode voltages and/or different voltage swings as well as for different numbers of data rates.

The present invention can be implemented for integrated circuits having either analog or digital comparators, although the invention is most advantageous when implemented for ICs having analog comparators.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. An integrated circuit comprising:

(a) digital logic, adapted to process data at two or more different processing speeds and configured to receive differential input data at two or more different data rates, wherein, for each data rate, the differential input data has a data prefix at a different common-mode voltage level;

(b) at least one comparator, configured to compare the common-mode voltage level of the data prefix to at least one reference voltage to determine the data rate of the differential input data and to provide a comparator code value to the digital logic, wherein the comparator code value identifies the data rate of the differential input data; and (c) a comparator-by-pass circuit, configured between the comparator and the digital logic, configured to receive a by-pass code value and selectively enabled to by-pass the comparator code value and to provide the by-pass code value to the digital logic.

2. The invention of claim 1, wherein the comparator-by-pass circuit comprises a mux (1) configured to receive the by-pass code value and the comparator code value as inputs and (2) configured to receive a by-pass control signal that determines whether the by-pass code value or the comparator code value is output from the mux to the digital logic.

3. The invention of claim 2, wherein the comparator-by-pass circuit comprises one mux for each comparator.

4. The invention of claim 2, wherein the comparator-by-pass circuit comprises one mux for all of the comparators.

5. The invention of claim 1, wherein each processing speed is equivalent to one of the data rates.

* * * * *